(12) United States Patent
Kuroki et al.

(10) Patent No.: US 11,040,409 B2
(45) Date of Patent: Jun. 22, 2021

(54) CUTTING MACHINE AND THERMOELECTRIC POWER GENERATION METHOD

(71) Applicant: JFE STEEL CORPORATION, Tokyo (JP)

(72) Inventors: Takashi Kuroki, Tokyo (JP); Koichi Tsutsumi, Tokyo (JP); Ikuhiro Sumi, Tokyo (JP); Yoshinobu Kuga, Tokyo (JP); Masayuki Fukami, Tokyo (JP); Yoshiki Fujii, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 172 days.

(21) Appl. No.: 16/338,784

(22) PCT Filed: Sep. 22, 2017

(86) PCT No.: PCT/JP2017/034308
§ 371 (c)(1),
(2) Date: Apr. 2, 2019

(87) PCT Pub. No.: WO2018/066389
PCT Pub. Date: Apr. 12, 2018

(65) Prior Publication Data
US 2020/0078881 A1    Mar. 12, 2020

(30) Foreign Application Priority Data

Oct. 4, 2016 (JP) .............................. JP2016-196760
Oct. 4, 2016 (JP) .............................. JP2016-196761

(51) Int. Cl.
*B23K 7/00* (2006.01)
*B23K 7/10* (2006.01)
(Continued)

(52) U.S. Cl.
CPC ............ *B23K 7/003* (2013.01); *B22D 11/126* (2013.01); *B22D 11/163* (2013.01); *B23K 7/10* (2013.01); *H01L 35/30* (2013.01)

(58) Field of Classification Search
CPC .... B22D 11/126; B22D 11/163; B23K 7/003; B23K 7/10; H01L 35/30
(Continued)

(56) References Cited

U.S. PATENT DOCUMENTS 3,137,184 A * 6/1964 Meyers ..................... B23C 5/28
                                                         408/56
2011/0061703 A1 * 3/2011 Imanari ................... H01L 35/30
                                                        136/205

(Continued)

FOREIGN PATENT DOCUMENTS

CN      2331458 Y       8/1999
CN      2637072 Y       9/2004
(Continued)

OTHER PUBLICATIONS

Jun. 17, 2019, the Extended European Search Report issued by the European Patent Office in the corresponding European Patent Application No. 17858228.4.
(Continued)

*Primary Examiner* — Scott R Kastler
*Assistant Examiner* — Michael Aboagye
(74) *Attorney, Agent, or Firm* — Kenja IP Law PC (57) ABSTRACT

Provided is a cutting machine that cuts a high-temperature moving object to be cut while moving in synchronization with the movement of the object to be cut, and that is capable of effectively protecting itself from the heat of the object to be cut and effectively utilizing the heat. A cutting machine for cutting a high-temperature moving object to be cut while moving in synchronization with the movement of the object
(Continued)

to be cut, comprising: a cutter configured to cut the object to be cut; a movement device configured to move the cutting machine in synchronization with the object to be cut; a water-cooling plate configured to cool the cutting machine; and a thermoelectric power generation device including a thermoelectric element for converting the heat of the object to be cut into electric energy, wherein the water-cooling plate also serves to cool a low-temperature side of the thermoelectric element.

7 Claims, 7 Drawing Sheets (51) Int. Cl.
  *B22D 11/126*  (2006.01)
  *B22D 11/16*  (2006.01)
  *H01L 35/30*  (2006.01)
(58) Field of Classification Search
  USPC .................................. 266/50; 83/171, 915.5
  See application file for complete search history.

(56) References Cited

U.S. PATENT DOCUMENTS

| | | | |
|---|---|---|---|
| 2012/0118526 A1 | 5/2012 | Sudau et al. | |
| 2016/0020375 A1* | 1/2016 | Kuroki | ................... B21B 45/00 |
| | | | 136/201 |

FOREIGN PATENT DOCUMENTS

| | | | |
|---|---|---|---|
| CN | 101260816 A | 9/2008 | |
| CN | 102421551 A | 4/2012 | |
| CN | 202427911 U | 9/2012 | |
| JP | S60108164 | * 6/1985 | ........... B22D 11/126 |
| JP | S60108164 A | 6/1985 | |
| JP | H05138316 A | 6/1993 | |
| JP | 2003053498 A | 2/2003 | |
| JP | 2013151023 A | 8/2013 | |
| JP | 5568271 B2 | 8/2014 | |
| JP | 2014217225 A | 11/2014 | |
| JP | 2015195643 A | 11/2015 | |
| JP | 2016059259 A | 4/2016 | |
| JP | 2016059260 A | 4/2016 | |
| KR | 2020000011761 U | 7/2000 | |
| KR | 1020060054948 A | 5/2006 | |
| KR | 1020150053270 A | 5/2015 | |
| WO | 2014050127 A1 | 4/2014 | |
| WO | 2014156178 A1 | 10/2014 | |

OTHER PUBLICATIONS

Jun. 7, 2020, Office Action issued by the Korean Intellectual Property Office in the corresponding Korean Patent Application No. 10-2019-7012485 with English language concise statement of relevance.
Nov. 21, 2017, International Search Report issued in the International Patent Application No. PCT/JP2017/034308.
Jul. 31, 2020, Office Action issued by the China National Intellectual Property Administration in the corresponding Chinese Patent Application No. 201780061555.9 with English language search report.
Jan. 26, 2021, Office Action issued by the China National Intellectual Property Administration in the corresponding Chinese Patent Application No. 201780061555.9.

* cited by examiner

CUTTING MACHINE AND THERMOELECTRIC POWER GENERATION METHOD

TECHNICAL FIELD

The present disclosure relates to a cutting machine for cutting a high-temperature moving object to be cut while moving in synchronization with the movement of the object to be cut; and more particularly, relates to a cutting machine capable of effectively protecting itself from the heat of an object to be cut and effectively utilizing the heat. In addition, the present disclosure relates to a method of performing thermoelectric power generation using the above cutting machine.

BACKGROUND

As a method of cutting an object to be cut such as a moving long material by a cutting machine, it is known to temporarily stop the movement of the object to be cut to cut it. However, in a production line and the like, there is a case in which the production efficiency is lowered due to the stop of the movement, and a case in which the movement cannot be stopped in the first place. For this reason, cutting has been performed while moving the cutting machine in synchronization, that is, at the same speed in the same direction, with the object to be cut.

For example, in the field of continuous casting, as described in JPS 60-108164 A (PTL 1) and JPH 05-138316 A (PTL 2), a slab is cut using a cutting machine that moves in synchronization with the slab. In general, cutting of a slab using such a cutting machine is performed as follows.

Initially, a slab withdrawn from a mold is cooled, and then conveyed to the cutting position by conveying rollers. Gas cutting using gas torches is widely used for cutting a slab; however, it takes a certain time to cut a thick slab throughout the entire width direction. Since the slab keeps moving on the conveying rollers during the cutting, it is necessary to perform the cutting while moving the cutting machine in synchronization with the slab, in order to cut straightly, that is, to cut perpendicularly to the longitudinal direction of the slab.

In order to move the cutting machine in synchronization with the slab, the cutting machine is provided with a movable carriage, and is configured to be able to run on rails provided along the conveying direction of the slab. The cutting machine is further provided with a clamping device for clamping the slab.

Upon starting cutting, the clamping device is operated to fix the relative position of the cutting machine with respect to the slab. Then, the cutting is performed while moving the cutting machine in synchronization with the slab; and when the cutting is completed, the fixation by the clamping device is released, and the synchronous movement of the cutting machine is ended.

Since the cutting machine is moved to the downstream side of the continuous casting line due to the above-described synchronous movement, a motor or the like is used to make the cutting machine run on the rails, and to return it to the position at the time of starting cutting on the upstream side.

Cutting of a slab in continuous casting is performed by repeating the above operations.

CITATION LIST

Patent Literature

PTL 1: JPS 60-108164 A
PTL 2: JPH 05-138316 A

SUMMARY

Technical Problem

However, a slab in continuous casting has an extremely high temperature of about 1000° C. during cutting, and for this reason, as described in paragraphs [0009] to [0012] of PTL 2, it is necessary to protect the cutting machine from the radiant heat of the slab. Therefore, it has been necessary to take measures such as installing piping on the lower surface, that is, the surface on the slab side, of the carriage of the cutting machine.

However, since the temperature of the slab is extremely high, it was difficult to sufficiently protect the cutting machine by the above method. Also, since a large-scale water-cooling device is required to improve the cooling efficiency, there was a limit in a cutting machine that needs to be moved as described above. Additionally, since the cooling water used in the cooling is generally drained as it is, the heat was not effectively utilized.

Therefore, it is an object of the present disclosure to provide a cutting machine that cuts a high-temperature moving object to be cut while moving in synchronization with the movement of the object to be cut, and that is capable of effectively protecting itself from the heat of the object to be cut and effectively utilizing the heat. It is also an object of the present disclosure to provide a thermoelectric power generation method using the above cutting machine.

Solution to Problem

Specifically, primary features of the present disclosure are as follows.

1. A cutting machine for cutting a high-temperature moving object to be cut while moving in synchronization with movement of the object to be cut, comprising:
   a cutter configured to cut the object to be cut;
   a movement device configured to move the cutting machine in synchronization with the object to be cut;
   a water-cooling plate configured to cool the cutting machine; and
   a thermoelectric power generation device including a thermoelectric element for converting heat of the object to be cut into electric energy, wherein
   the water-cooling plate also serves to cool a low-temperature side of the thermoelectric element.

2. The cutting machine according to 1., further comprising:
   a storage battery configured to accumulate electric power generated by the thermoelectric power generation device; and
   a motor configured to be driven by electric power supplied from at least one of the thermoelectric power generation device and the storage battery to move the cutting machine.

3. The cutting machine according to 1. or 2., wherein the water-cooling plate has a flow path through which a cooling water flows inside, and has the largest surfaces on both sides formed to be flat.

4. A cutting machine for cutting a high-temperature moving object to be cut while moving in synchronization with movement of the object to be cut, comprising:

a cutter configured to cut the object to be cut;

a movement device configured to move the cutting machine in synchronization with the object to be cut;

a thermoelectric power generation device including a thermoelectric element for converting heat of the object to be cut into electric energy;

a storage battery configured to accumulate electric power generated by the thermoelectric power generation device; and a motor configured to be driven by electric power supplied from at least one of the thermoelectric power generation device and the storage battery to move the cutting machine.

5. The cutting machine according to any one of 1. to 4., wherein the thermoelectric power generation device comprises a plurality of thermoelectric power generation units; and the plurality of thermoelectric power generation units are arranged according to at least one selected from the group consisting of a temperature of the object to be cut, a temperature of the thermoelectric power generation units, and an output from the thermoelectric power generation units.

6. The cutting machine according to 5., wherein the object to be cut has a low-temperature portion and a high-temperature portion; and a distance between the thermoelectric power generation units and the object to be cut at the low-temperature portion is smaller than a distance between the thermoelectric power generation units and the object to be cut at the high-temperature portion.

7. The cutting machine according to any one of 1. to 6., wherein the object to be cut has a low-temperature portion and a high-temperature portion;

the thermoelectric element is installed so as to face the low-temperature portion and the high-temperature portion; and the thermoelectric element is arranged more densely at the high-temperature portion than at the low-temperature portion.

8. A thermoelectric power generation method, comprising using the cutting machine according to any one of 1. to 7.

Advantageous Effect

According to the present disclosure, it is possible to provide the cutting machine that cuts a high-temperature moving object to be cut while moving in synchronization with the movement of the object to be cut, and that is capable of effectively protecting itself from the heat of the object to be cut and effectively utilizing the heat.

DETAILED DESCRIPTION

Next, a method of practicing the present disclosure is described in detail, taking cutting of a slab in continuous casting as an example. Note that the following merely describes some of the preferable embodiments of the present disclosure, and does not restrict the present disclosure.

Embodiment 1

Figure 1:
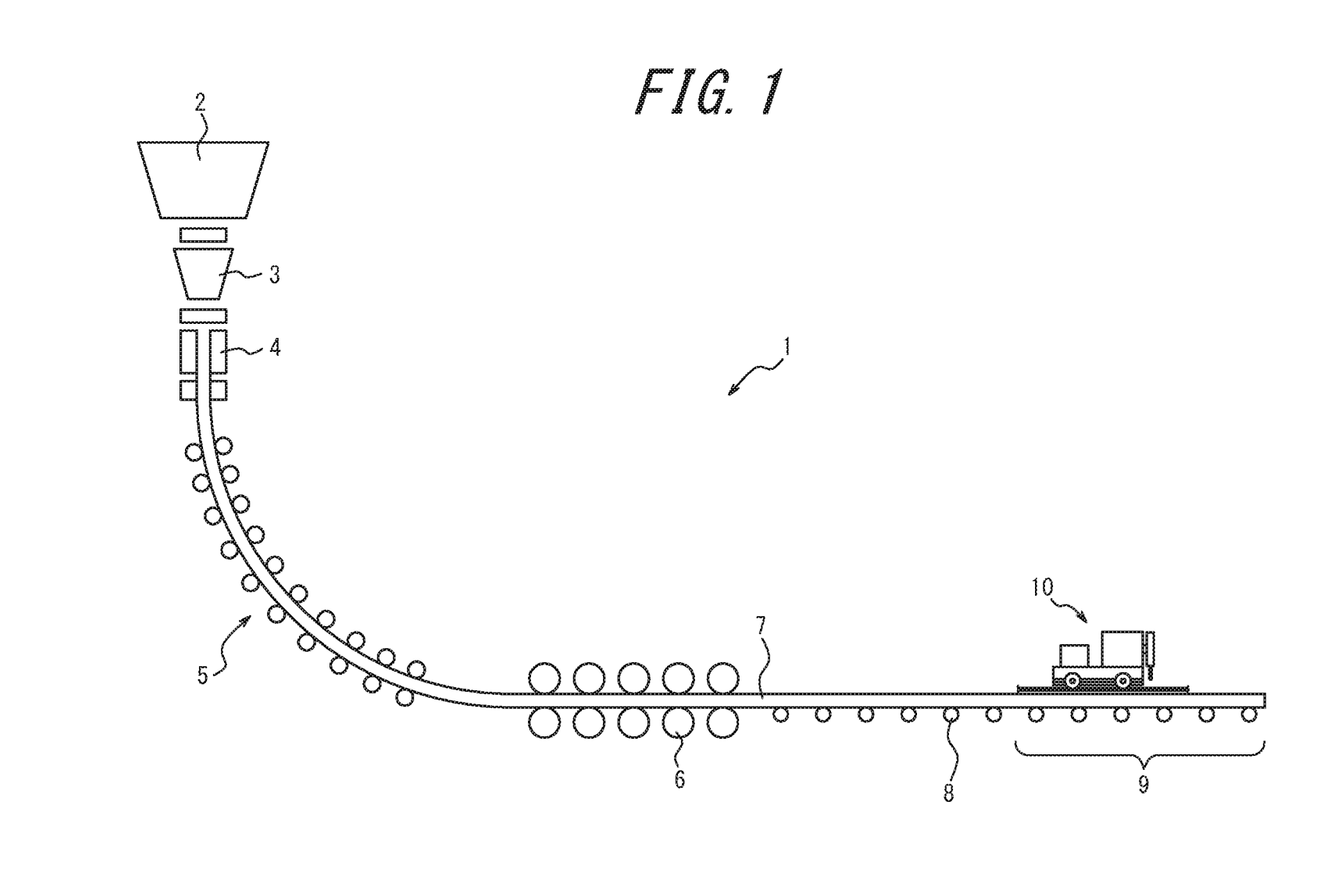
FIG. 1 schematically illustrates a continuous casting line using a cutting machine according to an embodiment of the present disclosure.

FIG. 1 schematically illustrates a continuous casting line 1 provided with a cutting machine according to an embodiment of the present disclosure. Molten steel held in a ladle 2 is poured into a mold 4 via a tundish 3. Then, the steel in a state in which solidification has started is pulled out from the mold 4 and is continuously cooled by a slab cooling device 5. Subsequently, the slab 7 is passed through a group of rollers 6 including an adjusting roll or the like, and thereafter, is conveyed to a downstream cutting position 9 by conveying rollers 8. The slab 7 is then cut by a cutting machine 10 installed above the slab 7 at the cutting position.

[Cutting Machine]
(Movement Device)

Figure 2:
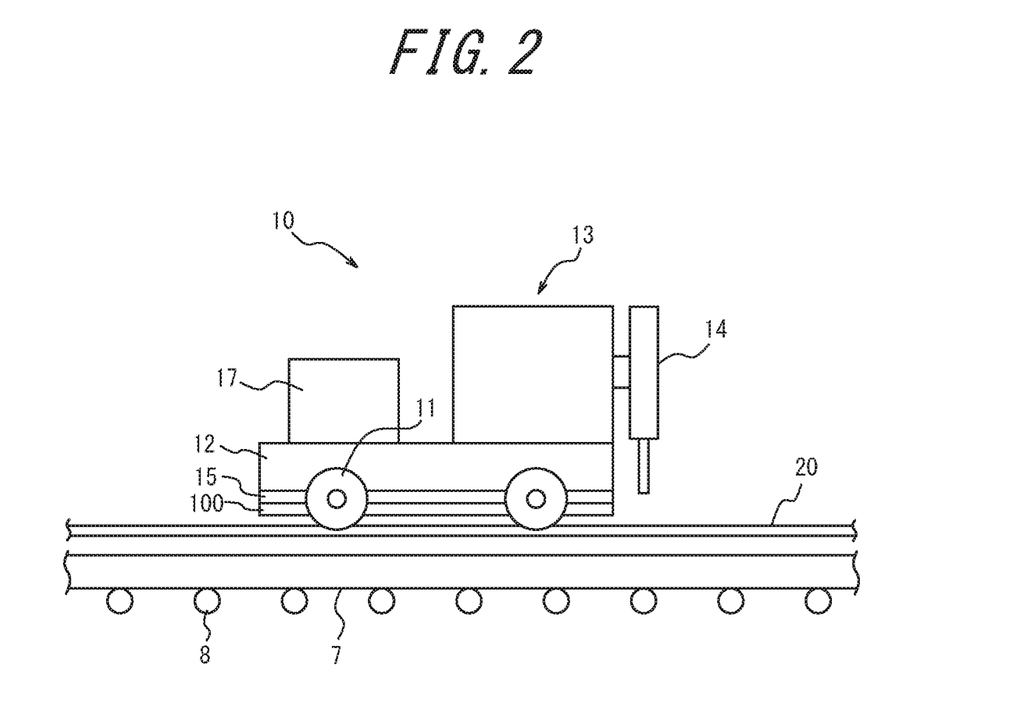
FIG. 2 schematically illustrates the cutting machine and slab according to the presently disclosed embodiment.

FIG. 2 schematically illustrates the cutting machine and slab according to the presently disclosed embodiment. Rails 20 are laid in parallel with the conveying direction of the slab 7 at both end portion sides in the width direction of the slab 7, and a cutting machine 10 is installed on the rails 20.

The cutting machine 10 is provided with a movement device for running on the rails 20. More particularly, the movement device has a carriage 12 provided with wheels 11 for running on the rails 20, and a drive unit (a motor or the like) that is not illustrated. Additionally, on the lower surface of the carriage 12, a clamping device that is not illustrated is installed. When performing cutting of the slab 7, the clamping device is operated to fix the relative position of the cutting machine 10 with respect to the slab 7. Then, the cutting is performed while moving the cutting machine 10 in synchronization with the slab 7; and when the cutting is completed, the fixation by the clamping device is released, and the synchronous movement of the cutting machine 10 is ended.

(Cutter)

A cutter 13 provided with at least one torch 14 for cutting the slab 7 is placed on the carriage 12. As the torch 14, a gas torch or the like can be used. The cutter 13 includes a torch driver configured to move the torch 14 in the width direction of the slab 7. The cutter 13 may also include two or more torches 14.

(Water-Cooling Plate)

On the lower surface, that is, the side facing the slab 7, of the carriage 12, a water-cooling plate 15 is installed so as to be in contact with the lower surface of the carriage 12. By installing the water-cooling plate in this manner, it is possible to cool the cutting machine 10 heated by the radiant heat or the like from the slab 7 as the heat source. Additionally, a thermoelectric power generation device 100 is installed on the lower surface of the water-cooling plate 15 so as to be in contact with the lower surface of the water-cooling plate 15. As will be described later, the water-cooling plate 15 also serves to cool the low-temperature side of the thermoelectric element included in the thermoelectric power generation device 100. Here, the "water-cooling plate" refers to a plate-like member configured to cool an object in contact with the water-cooling plate by allowing water as cooling water to flow inside.

As the water-cooling plate 15, an arbitrary one can be used, as long as it is possible to simultaneously cool the cutting machine 10 and the low-temperature side of the thermoelectric element. In terms of thermal (heat) conductivity, the water-cooling plate 15 is preferably made of metal; and as the metal, at least one selected from copper, a copper alloy, aluminum, and an aluminum alloy is preferably used.

Further, in terms of improving cooling efficiency, it is preferable to use a water-cooling plate having a pair of the largest surfaces facing each other, which are both flat; and having a flow path through which cooling water flows inside.

Figure 3A:
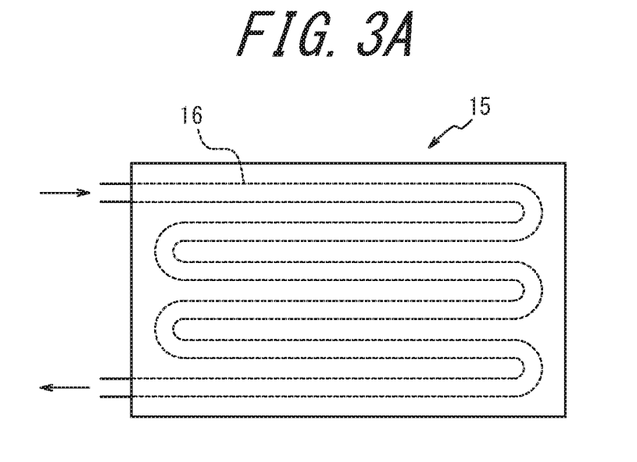
FIGS. 3A and 3B schematically illustrate a water-cooling plate according to the presently disclosed embodiment.
Figure 3B:
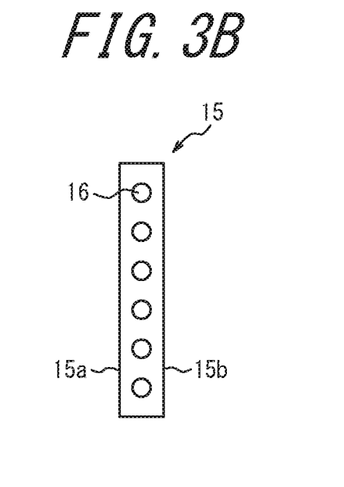

FIGS. 3A and 3B schematically illustrate an example of a water-cooling plate having the above structure. The water-cooling plate 15 in this example is formed from one plate-like member having the largest surfaces 15a and 15b on both sides formed to be flat. In addition, a flow path 16 through which cooling water flows is formed inside the water-cooling plate 15. The water-cooling plate can be manufactured, for example, by processing a metal plate, and forming a flow path inside the metal plate. The water-cooling plate can also be manufactured by embedding piping for forming a flow path 16 that is made of copper, a copper alloy or the like inside a metal plate made of aluminum, an aluminum alloy or the like. In the flow path 16, cooling water flows as indicated by the arrows illustrated in FIG. 3A.

In the case in which water cooling is performed merely for the purpose of cooling the cutting machine, a conventional water-cooling panel in which, for example, a pipe through which cooling water passes and a plate-like fin provided to connect two adjacent pipes are arranged alternately, can be used. However, since in a water-cooling panel having such a shape, the pipe portions are different in thickness from the fin portions, when such a water-cooling panel is used as the water-cooling plate, the water-cooling panel and the thermoelectric element are only in contact with each other at pipe portions which are thick, and are not in contact with each other at the other portions. As a result, the contact area decreases. On the contrary, when the above-described water-cooling plate having the largest surfaces on both sides formed to be flat is used, it is possible to bring the entire low-temperature side of the thermoelectric element into contact with the water-cooling plate, such that the cooling efficiency is improved, and as a result, thermoelectric power generation can be performed more effectively.

(Thermoelectric Power Generation Device)

As the thermoelectric power generation device 100, an arbitrary one can be used, as long as it is provided with a thermoelectric element (also referred to as "thermoelectric conversion element") for converting the heat of the object to be cut (the slab 7 in the case of the present embodiment) into electric energy.

Thermoelectric Element

The thermoelectric element (hereinafter, sometimes simply referred to as "element") is not particularly limited, and an arbitrary one can be used as long as it has the function of thermoelectric power generation. Generally, a thermoelectric element has a structure in which a p-type semiconductor and an n-type semiconductor are combined. Examples of the thermoelectric element include, a BiTe-based material, a PbTe-based material, a Si—Ge-based material, a silicide-based material, a skutterudite-based material, a transition metal oxide-based material, a zinc antimony-based material, a boron compound, a clathrate compound, a cluster solid, a zinc oxide-based material, and carbon nanotubes.

A thermoelectric element is capable of converting heat into electric energy by forming a temperature difference between both ends. In the present disclosure, the temperature difference is formed by directing one side (the high-temperature side) of the thermoelectric element to the object to be cut (the slab in the present embodiment), and cooling the other side (the low-temperature side) of the thermoelectric element by the above-described water-cooling plate.

The method of mounting the thermoelectric element on the thermoelectric power generation device 100 is not particularly limited; however, as described below, it is preferable to adopt a structure in which the thermoelectric power generation device is constituted by a plurality of thermoelectric power generation units, each thermoelectric power generation unit is constituted by a plurality of thermoelectric power generation modules, and each thermoelectric power generation module is constituted by a plurality of thermoelectric elements. Hereinafter, an example thereof is described.

Thermoelectric Power Generation Module

Since the electromotive force per thermoelectric element is not so large, generally, several tens to several thousands of thermoelectric elements are connected in series using electrodes and used. One set of thermoelectric elements connected in series is called a thermoelectric power generation module. The thermoelectric elements constituting the thermoelectric power generation module (hereinafter, sometimes simply referred to as "module") are arranged two-dimensionally (in the horizontal direction). An insulating substrate may be provided on one or both of the upper and lower sides of the arranged elements.

Thermoelectric Power Generation Unit

Further, a plurality of thermoelectric power generation modules may be electrically connected to constitute a thermoelectric power generation unit (hereinafter, sometimes simply referred to as "unit"). The electrical connection may be in series, in parallel, or a combination thereof. By combining a plurality of modules as a unit in this way, electric power can be taken out collectively for each unit, such that wiring becomes easy.

The size of each thermoelectric power generation unit is preferably 1 $m^2$ or less. By setting the area of each unit to be 1 $m^2$ or less, it is possible to reduce the deformation amount of each thermoelectric power generation unit due to heat. The area of each unit is preferably $2.5 \times 10^{-1}$ $m^2$ or less.

The thermoelectric elements within each thermoelectric power generation unit are arranged such that the low-temperature side of each thermoelectric element faces the same surface of the unit. Here, the surface is the low-temperature side of the thermoelectric power generation unit. The low-temperature side of the thermoelectric power generation unit is in contact with the above-described water-cooling plate, such that the low-temperature side of each thermoelectric element is cooled by the water-cooling plate. As in the present embodiment, when the thermoelectric power generation device is constituted by a plurality of thermoelectric power generation units, it is preferable to provide a water-cooling plate for each unit. In this case, cooling water supply piping may be provided such that cooling water can be independently supplied to individual water-cooling plates, or may be provided such that each water-cooling plate can be connected in series or in parallel to supply cooling water. In addition, it is also possible to dispose a water-cooling unit so as to cover the low-temperature side of each of the plurality of units with one water-cooling plate.

When the thermoelectric power generation device has a plurality of thermoelectric power generation units, the density of the thermoelectric elements in each thermoelectric power generation unit may be the same or different. As will be described later, it is also possible to intentionally change the density of the thermoelectric elements in each thermoelectric power generation unit according to the temperature of the object to be cut or the like.

(Region in which Thermoelectric Elements are Installed)

Figure 4:
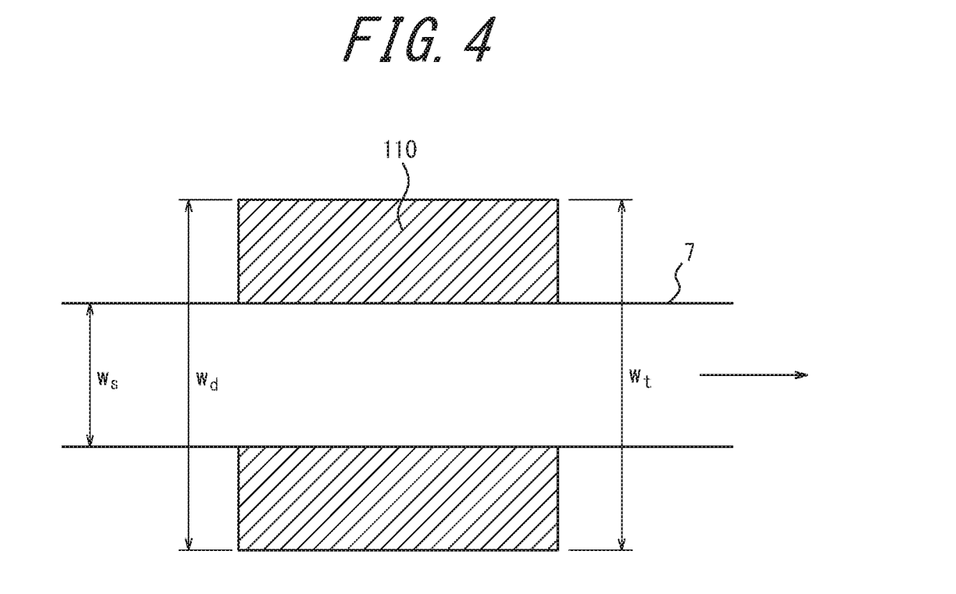
FIG. 4 schematically illustrates an installation form of thermoelectric power generation units according to the presently disclosed embodiment.
Figure 5:
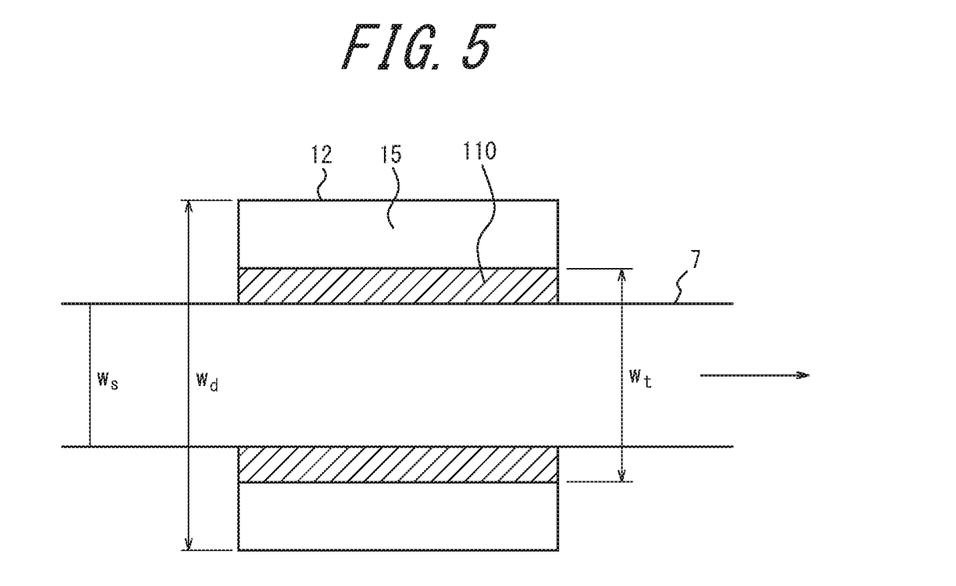
FIG. 5 schematically illustrates an installation form of thermoelectric power generation units according to another embodiment of the present disclosure.

FIG. 4 schematically illustrates an installation form of thermoelectric elements according to the presently disclosed embodiment; and FIG. 5 schematically illustrates an installation form of thermoelectric elements according to another embodiment of the present disclosure. FIGS. 4 and 5 illustrate the slab 7 being conveyed and the cutting machine 10 in a state as viewed from the lower surface of the slab 7 (the lower side in FIG. 1).

In FIGS. 4 and 5, the reference sign 110 denotes a region in which thermoelectric elements are installed. In the example illustrated in FIG. 4, the thermoelectric elements are provided on the entire lower surface of the carriage 12 of the cutting machine 10. Accordingly, the region 110 in which the thermoelectric elements are installed has a width $w_t$ equal to the width $w_d$ of the carriage 12. Further, the width $w_d$ of the carriage and the width $w_t$ of the region 110 in which the thermoelectric elements are installed are both larger than the width $w_s$ of the slab 7. By making the width $w_t$ of the region 110 in which the thermoelectric elements are installed larger than the width $w_s$ of the slab 7, the thermoelectric power generation device 100 can receive heat from the slab 7 without wasting it. Here, the "width" refers to the width in a direction perpendicular to the conveying direction of the slab 7 (the direction indicated by the arrow in FIG. 4) and parallel to the surface of the slab 7 (the up-down direction in FIG. 4). In addition, the "region in which the thermoelectric elements are installed" refers to the region in which the thermoelectric power generation modules are installed, when the thermoelectric elements are installed using thermoelectric power generation modules; and refers to the region in which the thermoelectric power generation units are installed, when the thermoelectric elements are installed using thermoelectric power generation units.

On the other hand, in the example illustrated in FIG. 5, the region 110 in which the thermoelectric elements are installed has a width $w_t$ smaller than the width $w_d$ of the carriage 12. Generally, the width of the carriage 12 is considerably larger than the width $w_s$ of the slab 7. Therefore, even if the thermoelectric elements are installed over the entire width of the carriage 12 as illustrated in FIG. 4, the amount of heat received by the thermoelectric elements installed outside the width of the slab 7 is lower than that received by the elements installed directly above the slab 7. As a result, power generation efficiency corresponding to the cost required for installing thermoelectric elements over the entire width cannot be obtained in some cases. Therefore, it is preferable to set the width $w_t$ of the region 110 in which the thermoelectric elements are installed smaller than the width $w_d$ of the carriage 12. On the other hand, in order to sufficiently receive the heat of the slab 7, it is preferable to set the width $w_t$ of the region 110 in which the thermoelectric elements are installed equal to or larger than the width $w_s$ of the slab 7. Accordingly, it is preferable that $w_s \leq w_t \leq w_d$.

Further, as illustrated in FIG. 5, when the width $w_d$ of the carriage 12 is larger than the width $w_s$ of the slab 7, the temperature also rises in the portions outside the width of the slab 7 due to radiation heat or the like from the slab 7. Therefore, even when the width $w_t$ of the region 110 in which the thermoelectric elements are installed is set smaller than the width $w_d$ of the carriage 12 as described above, it is preferable that the width of the water-cooling plate 15 is larger than the width $w_t$ of the region 110 in which the thermoelectric elements are installed. More particularly, the width of the water-cooling plate 15 is preferably 80% or more, more preferably 90% or more, and further preferably 100% of the width $w_d$ of the carriage 12. Thereby, it is possible to cool the entire lower surface of the cutting machine 10, even when the thermoelectric elements are only partially installed.

In order to make the width of the water-cooling plate 15 larger than the width $w_t$ of the region 110 in which the thermoelectric elements are installed, additional water-cooling plates may be disposed in the regions in which thermoelectric elements are not installed. As another method, it is also possible to enlarge the size of the water-cooling plate installed in the region 110 in which the thermoelectric elements are installed, such that the water-cooling plate extends to the outside of the region 110 in which the thermoelectric elements are installed.

Note that, the width $w_s$ of the slab 7 is not constant. It varies depending on the product to be manufactured even in the same continuous casting line, and is generally about 0.65 to 2.3 m. Therefore, it is preferable to set the width $w_t$ of the region 110 in which the thermoelectric elements are installed to 0.65 to 2.3 m.

In terms of the amount of power generation, as illustrated in FIGS. 4 and 5, it is preferable to provide thermoelectric elements over the entire length in the slab conveying direction of the carriage 12. When another device (for example, a clamping device) is installed on the lower surface of the carriage 12, the thermoelectric elements may be disposed at positions where these devices are not installed.

(Heat Receiving Sheet)

It is preferable that the thermoelectric power generation device 100 further includes a heat receiving sheet. The heat receiving sheet is installed on the high-temperature side, that is, the side facing the slab, of the thermoelectric elements. Accordingly, when a heat receiving sheet is provided, the thermoelectric elements are sandwiched between the water-cooling plate installed on the low-temperature side of the elements and the heat receiving sheet installed on the high-temperature side of the elements. Further, when a plurality of thermoelectric power generation units are used, it is preferable to provide a heat receiving sheet for the high-temperature side of each thermoelectric power generation unit. When the thermoelectric power generation device includes a plurality of thermoelectric power generation units, it is possible to either provide an independent heat receiving sheet for each unit, or provide a single heat receiving sheet so as to cover the plurality of units.

In terms of heat resistance and thermal conductivity, the material property of the heat receiving sheet is preferably at least one selected from metal, ceramic, and carbon. Examples of the metal include iron, steel, copper, a copper alloy, aluminum, and an aluminum alloy. By providing such a heat receiving sheet, heat from the heat source is received by the heat receiving sheet and then transmitted from the heat receiving sheet to the thermoelectric elements, thereby improving the thermoelectric power generation efficiency.

When a heat receiving sheet is provided, the ratio of the area of the thermoelectric element group provided under the heat receiving sheet to the area of the heat receiving sheet is preferably set to 0.2 or more, and more preferably set to 0.3 or more. When the ratio is less than 0.2, the heat released by the thermoelectric elements decreases with respect to heat input due to radiant heat or the like from the heat resource, such that the temperature rises and exceeds the heatproof temperature of the thermoelectric power generation device, which may cause damage to the thermoelectric power generation device.

For example, when the thermoelectric power generation device is constituted by a thermoelectric power generation unit and a heat receiving sheet provided on the high-temperature side of the thermoelectric power generation unit, it is preferable that the ratio of the area of the thermoelectric element group provided in the thermoelectric power generation unit to the area of the heat receiving sheet is within the above range.

(Heat Conduction Sheet)

The thermoelectric power generation device of the present disclosure may further include a heat conduction sheet. The heat conduction sheet may be suitably installed at positions, for example, between the thermoelectric elements and the water-cooling plate, and between the thermoelectric elements and the heat receiving sheet. When the thermoelectric elements are installed in the form of a thermoelectric power generation unit, the heat conduction sheet is preferably installed between the unit and the water-cooling plate and between the unit and the heat receiving sheet. By installing the heat conduction sheet in this manner, it is possible to reduce the contact thermal resistance between members, and further improve the thermal power generation efficiency. As the heat conduction sheet, for example, a sheet made of graphite or the like can be used.

Embodiment 2

A cutting machine according to Embodiment 2 of the present disclosure is a cutting machine for cutting a high-temperature moving object to be cut while moving in synchronization with the movement of the object to be cut, comprising the following (1) to (5):
(1) a cutter configured to cut the object to be cut;
(2) a movement device configured to move the cutting machine in synchronization with the object to be cut;
(3) a thermoelectric power generation device including a thermoelectric element for converting the heat of the object to be cut into electric energy;
(4) a storage battery configured to accumulate electric power generated by the thermoelectric power generation device; and
(5) a motor configured to be driven by electric power supplied by at least one of the thermoelectric power generation device and the storage battery to move the cutting machine.

As described above, the cutting machine moves in synchronization with the object to be cut to the downstream, and when the cutting is completed, it is necessary to perform a return-to-origin operation to return the cutting machine to the position on the upstream side. In a conventional cutting machine, electric power is supplied from the outside to drive the motor, thereby performing the return-to-origin operation. For this reason, in a conventional cutting machine, it is necessary to connect the wiring for electric power supply to the cutting machine, resulting in a complicated device structure.

On the other hand, in PTL 2, it has been proposed to electrically or mechanically accumulate the kinetic energy when the cutting machine moves in synchronization with the slab, and to perform the return-to-origin operation for the cutting machine using the accumulated energy. The specific method described is to turn the generator by utilizing the synchronous movement to obtain electric power, wind up the spiral spring, and the like.

However, since the synchronous movement of the cutting machine is realized by clamping the slab, extra energy is required to convey the slab when a work such as power generation is performed utilizing the synchronous movement, which applies load to the continuous casting line.

Further, as described above, a slab in continuous casting has an extremely high temperature of about 1000° C. during cutting, and therefore, as described in paragraphs [0009] to [0012] of PTL 2, it is necessary to protect the cutting machine from the radiant heat from the slab. Therefore, it has been necessary to take measures such as water cooling the cutting machine.

However, since the cooling water used in the cooling is generally drained as it is, the heat was not effectively utilized.

On the other hand, in the cutting machine of the present embodiment, it is possible to perform power generation utilizing the heat of the object to be cut, by including the thermoelectric power generation device of the above (3). Also, it is possible to suppress the temperature rise of the cutting machine, by converting at least a part of the heat into electric power.

Further, it is possible to use the electric power generated by the thermoelectric power generation device to move the cutting machine itself, by including the motor of the above (5). For this reason, the presently disclosed cutting machine does not require electric power supply from the outside and equipment such as wiring for that purpose. Therefore, the line configuration can be simplified, and the movement of the cutting machine is not restricted by the wiring.

Furthermore, it is possible to accumulate the electric power obtained by thermal power generation and utilize the accumulated electric power at an arbitrary timing, by including the storage battery (rechargeable battery) of the above (4). Accordingly, it is possible to utilize the electric power accumulated in the rechargeable battery to move the cutting machine, even when the object to be cut as the heat source is not in the vicinity of the thermoelectric power generation device and thermal power generation cannot be performed.

In this manner, the cutting machine of the present embodiment is possible to move without electric power supply from the outside, and effectively utilize the heat of the object to be cut that has not been utilized.

Next, the cutting machine according to the present embodiment and the method of using the same is described in detail, taking cutting of a slab in continuous casting as an example. Note that the following merely describes a preferable embodiment of the present disclosure, and does not restrict the present disclosure. Further, matters that are not particularly mentioned can be made the same as in Embodiment 1.

The cutting machine of the present embodiment can be used in, for example, the continuous casting line 1 illustrated in FIG. 1, similarly to Embodiment 1.

[Cutting Machine]
(Movement Device)

The cutting machine of the present disclosure, for example, may have the structure illustrated in FIG. 2, similarly to Embodiment 1. The cutting machine 10 is installed on the rails 20 laid at both end sides in the width direction of the slab 7 in parallel with the conveying direction of the slab 7.

The cutting machine 10 includes a movement device for running on the rails 20. More particularly, the movement device has a carriage 12 provided with wheels 11 for running on the rails 20, and a motor that is not illustrated. On the lower surface of the carriage 12, a clamping device that is not illustrated is installed. When performing cutting of the slab 7, the clamping device is operated to fix the relative position of the cutting machine 10 with respect to the slab 7. The cutting is performed while moving the cutting machine 10 in synchronization with the slab 7; and when the cutting is completed, the fixation by the clamping device is released, and the synchronous movement of the cutting machine 10 is ended.

(Cutter)

A cutter 13 provided with at least one torch 14 for cutting the slab 7 is placed on the carriage 12. As the torch 14, a gas torch or the like can be used. The cutter 13 includes a torch driver configured to move the torch 14 in the width direction of the slab 7. The cutter 13 may include two or more torches 14.

(Water-Cooling Plate)

The cutting machine of the present embodiment also includes a water-cooling plate for cooling the cutting machine. Similarly to Embodiment 1, the water-cooling plate may also serve to cool the low-temperature side of each thermoelectric element. As the water-cooling plate, the same one as that described in Embodiment 1 can be used. Note that, as will be described later in Embodiment 3, the water-cooling plate for cooling the cutting machine may be not provided.

(Thermoelectric Power Generation Device)

As the thermoelectric power generation device, the same one as that described in Embodiment 1 can be used.

[Storage Battery]

The cutting machine 10 further includes a storage battery 17 that is capable of accumulating electric power generated by the thermoelectric power generation device 100. The installation position of the storage battery 17 is not particularly limited; and for example, it can be installed on the carriage 12 as illustrated in FIG. 2.

As the storage battery 17, an arbitrary one can be used as long as it is capable of accumulating generated electric power. Examples of the storage battery 17 include a lead storage battery, a lithium ion secondary battery, a lithium ion polymer secondary battery, a nickel-hydrogen storage battery, and a nickel-cadmium storage battery.

[Motor]

The cutting machine 10 further includes a motor that is not illustrated. The motor is configured to be driven by electric power supplied from at least one of the thermoelectric power generation device 100 and the storage battery 17 to move the cutting machine 10. Accordingly, the motor is electrically connected to the thermoelectric power generation device 100 and the storage battery 17. As the motor, a direct current motor is preferably used. This is because, a direct current motor can utilize the direct current supplied from the thermoelectric power generation device 100 and the storage battery 17 without converting it into alternating current.

In one embodiment, the motor may be configured to drive the wheels 11. In this case, the wheels 11 are rotatable when performing cutting of the slab 7, and the cutting machine 10 is moved in synchronization with the slab 7 using the clamping device. On the other hand, when the cutting machine 10 is moved by the motor, the wheels 11 are driven by the motor to move the cutting machine 10 in a state in which the clamp by the clamping device is released.

[Other Load]

The electric power supplied from the thermoelectric power generation device 100 and the storage battery 17 may also be used for other purposes. For example, electric power may be preferably used to drive the torch driver for driving the torch 14 of the cutter 13. Also, the electric power may be used to drive any other devices included in the cutter 10; and is preferably used to drive all the devices included in the cutter 10 that require electricity, including the motor and the torch driver. For example, the controller that will be described later may also be driven by the electric power.

[Power Control Unit]

The cutting machine 10 may include a power control unit for controlling at least one of the thermoelectric power generation device 100, the storage battery 17, and the motor. Examples of devices and apparatuses that the power control unit can include are listed below.

(Converter)

The power control unit may include a converter. By using the converter, it is possible to change the voltage of the current output from the thermoelectric power generation device 100 or the storage battery 17. For example, by using a boost converter, it is possible to convert the output from the thermoelectric power generation device 100 or the storage battery 17 into voltage suitable for driving the motor or the like.

(Inverter)

The current output from the thermoelectric power generation device 100 or the storage battery 17 is direct current, and by using an inverter, it is possible to convert it into alternating current for driving a device for alternating current. However, when a plurality of inverters is used in parallel, it is necessary to arrange the phases of the alternating currents output from the respective inverters so as to be aligned.

(Power Supply Switching Device)

It is preferable to provide a power supply switching device capable of switching between the thermoelectric power generation device 100 and the storage battery 17, as to from which electric power is supplied to the load such as the motor (hereinafter, sometimes simply referred to as "load"). For example, when the amount of power generation by the thermoelectric power generation device 100 is sufficiently high, it is possible to drive the load only with the electric power from the thermoelectric power generation device 100. On the other hand, when the amount of power generation by the thermoelectric power generation device 100 is insufficient, it is possible to drive the load with both the electric power from the thermoelectric power generation device 100 and the electric power from the storage battery 17, or drive the load only with the electric power from the storage battery 17. It is also possible to drive the load with the electric power from the storage battery 17, while charging the storage battery 17 with the electric power from the thermoelectric power generation device 100. Further, when there is no need to drive the load, it is possible to switch so as to charge the storage battery 17 with the electric power from the thermoelectric power generation device 100 without sending it to the load. By the power supply switching device, switching of the power source can be performed as described above.

(MPPT Device)

The power control unit may further include a maximum power point tracking (MPPT) device. The MPPT device controls the power generation point such that the maximum energy can be obtained according to the power generation performance of the thermoelectric power generation device 100. Therefore, power generation efficiency can be improved.

Embodiment 3

A cutting machine according to Embodiment 3 of the present disclosure is, similarly to the above Embodiment 2, a cutting machine for cutting a high-temperature moving object to be cut while moving in synchronization with the movement of the object to be cut, comprising the following (1) to (5):
(1) a cutter configured to cut the object to be cut;
(2) a movement device configured to move the cutting machine in synchronization with the object to be cut;
(3) a thermoelectric power generation device including a thermoelectric element for converting heat of the object to be cut into electric energy;
(4) a storage battery configured to accumulate electric power generated by the thermoelectric power generation device; and
(5) a motor configured to be driven by electric power supplied by at least one of the thermoelectric power generation device and the storage battery to move the cutting machine.

However, the cutting machine of the present embodiment is different from that of Embodiment 2 in that it does not include a water-cooling plate that serves to cool both the cutting machine and the low-temperature side of each thermoelectric element. Matters except for this can be made the same as in Embodiment 2 unless otherwise specified. By including the thermoelectric power generation device, it is possible to convert a part of the heat from the object to be cut into electric power and suppress the temperature rise of the cutting machine.

The cutting machine of the present embodiment may include one or both of a water-cooling plate only for cooling the cutting machine and a water-cooling plate only for cooling the thermoelectric power generation device. Here, the water-cooling plate only for cooling the cutting machine refers to a water-cooling plate provided so as to be in contact with the cutting machine and not in direct contact with the thermoelectric power generation device. The water-cooling plate only for cooling the cutting machine can be installed, for example, on the lower surface (the surface on the heat source side) of the carriage of the cutting machine. Additionally, the water-cooling plate only for cooling the thermoelectric power generation device refers to a water-cooling plate provided so as to be in contact with the thermoelectric power generation device and not in direct contact with the cutting machine. The water-cooling plate only for cooling the thermoelectric power generation device can be installed on the low-temperature side (the surface on the side opposite to the heat source) of the thermoelectric power generation device. Thereby, it is possible to cool the low-temperature side of each thermoelectric element included in the thermoelectric power generation device.

Embodiment 4

A cutting machine of the present embodiment may further include a distance control unit for controlling the distance between the thermoelectric power generation device and the object to be cut by moving the thermoelectric power generation device. Note that in the present embodiment, matters that are not described below can be made the same as in Embodiment 3.

[Distance Control Unit]

The power generation efficiency of a thermoelectric element depends on the temperature difference between the high-temperature side and the low-temperature side of the thermoelectric element. The temperature on the high-temperature side depends not only on the temperature of the heat source, but also on the aforementioned distance. Accordingly, by using the distance control unit to change the aforementioned distance, the thermoelectric power generation efficiency can be controlled.

In addition, a thermoelectric element and a thermoelectric power generation unit using the thermoelectric element have a heatproof temperature determined by the material and the like used for the element and the unit, and when they are exposed to high temperature exceeding the heatproof temperature, the element is damaged, and the performance of the element may be deteriorated. By using the above-described distance control unit, it is possible to adjust the distance such that the temperature of the thermoelectric power generation unit does not exceed the heatproof temperature.

In the present embodiment, in order to cool the low-temperature side of the thermoelectric elements, it is preferable to provide a water-cooling plate so as to be in contact with the low-temperature side (the side opposite to the slab) of the thermoelectric power generation device. In this case, the water-cooling plate can be moved along with the thermoelectric power generation device by the distance control unit. When the thermoelectric power generation device and the water-cooling plate are raised by the distance control unit, that is, moved toward the side opposite to the slab, such that the water-cooling plate is brought into contact with the lower surface of the pedestal of the cutting machine, the pedestal of the cutting machine can be cooled by the water-cooling plate. As the water-cooling plate, the same one as in Embodiment 1 can be used.

(Drive Unit)

The distance control unit includes a drive unit for moving the thermoelectric power generation device. As the drive unit, an arbitrary one can be used as long as it is possible to move the thermoelectric power generation device. In terms of positioning accuracy, it is preferable to use an electric cylinder as the drive unit. For example, the drive unit may be configured so as to be able to move (raise and lower) the thermoelectric power generation device in a direction approaching the object to be cut and in a direction getting away from the object to be cut (the up-down direction in FIGS. 1 and 2).

The drive unit may be configured to move the entire thermoelectric power generation device. In this case, the thermoelectric power generation units constituting the thermoelectric power generation device are all moved together. However, the object to be cut as the heat source has a temperature distribution, and sometimes the temperature varies depending on parts. For example, when the object to be cut is a steel slab manufactured in continuous casting, sometimes the temperature at the end portions is lower than the temperature at the central portion in the width direction of the slab due to difference in cooling speed. Therefore, it is preferable that the drive unit can independently adjust the positions of the plurality of thermoelectric power generation units included in the thermoelectric power generation device, such that the positions of the thermoelectric power generation units can be adjusted according to such a temperature distribution. In other words, it is preferable that the distance control unit can independently adjust the distances between the respective plurality of thermoelectric power generation units included in the thermoelectric power generation device and the object to be cut.

(Output Meter)

It is preferable that the distance control unit includes an output meter for monitoring the output of the thermoelectric power generation device. The output meter may be one provided in the above-described power control unit.

(Distance Sensor)

It is preferable that the distance control unit includes a distance sensor for measuring the distance between the thermoelectric power generation device and the object to be cut.

(Temperature Sensor for Heat Source)

The distance control unit may include a temperature sensor for heat source to measure the temperature of the object to be cut as the heat source. The temperature sensor for heat source may be provided on the cutting machine main body, or at a position separated from the cutting machine main body. When the temperature sensor for heat source is installed at a position separated from the cutting machine main body, it is preferable to install it, for example, on the upstream side in the conveying line of the object to be cut. In this case, the temperature measured by the temperature sensor for heat source may be transmitted to the cutting machine in a wireless manner or a wired manner. As the temperature sensor for heat source, any of a non-contact type temperature sensor such as a radiation thermometer, and a contact type temperature sensor such as a thermocouple can be used.

(Temperature Sensor for Thermoelectric Power Generation Unit)

The distance control unit may include a temperature sensor for thermoelectric power generation unit to measure the temperature of the thermoelectric power generation unit. The temperature sensor for thermoelectric power generation unit may be installed separately from the thermoelectric power generation unit, or installed inside the thermoelectric power generation unit. As the temperature sensor for thermoelectric power generation unit, any one of a non-contact type temperature sensor such as a radiation thermometer, and a contact type temperature sensor such as a thermocouple can be used.

It is preferable that the distance control unit of the present embodiment is configured to measure at least one selected from the group consisting of the temperature of the object to be cut, the temperature of the thermoelectric power generation unit, and the output from the thermoelectric power generation unit; and control the distance between the thermoelectric power generation unit and the object to be cut based on the result of the above measurement. More particularly, it is preferable to control the distance between the thermoelectric power generation unit and the object to be cut using the measurement value of at least one of the output meter, the temperature sensor for heat source, or the temperature sensor for thermoelectric power generation unit.

The control of the distance can be performed continuously. When the control is performed continuously, for example, feedback control and feedforward control can be performed.

Feedback Control Based on Output

For example, it is possible to set the rated output of the thermoelectric power generation device as a target value, and control the distance such that, the output of the thermoelectric power generation device actually measured by the output meter approaches the target value. When this control is performed, it is preferable that the temperature is monitored simultaneously using the temperature sensor for the thermoelectric power generation device, and the distance is controlled such that the temperature of the thermoelectric power generation device does not exceed the heatproof temperature.

Feedforward Control Based on Temperature of Heat Source

For example, it is possible to measure the temperature of the object to be cut at the upstream side, and control the distance according thereto. More particularly, when the temperature of the object to be cut is low, the thermoelectric power generation device is brought close to the object to be cut; and when the temperature of the object to be cut is high, the thermoelectric power generation device is moved away from the object to be cut.

Control Based on Operating Conditions

If the operating conditions are known in advance, the distance can also be controlled based on the operating conditions. In this case, the distance can be adjusted in advance before the start of operation; and if the operating conditions change during the operation, the distance can be controlled continuously or intermittently accordingly. For example, in the continuous casting line illustrated in FIG. 1, the temperature of the object to be cut during cutting is determined by the withdrawal rate of the slab, the cooling conditions, and the like. Therefore, the distance can be controlled based on these operating conditions.

Embodiment 5

As described above, the object to be cut as the heat source has a temperature distribution, and sometimes the temperature varies depending on parts. Therefore, in the cutting machine of the present embodiment, the thermoelectric power generation device is constituted by a plurality of thermoelectric power generation units, and the plurality of thermoelectric power generation units are arranged according to at least one selected from the group consisting of the temperature of the object to be cut, the temperature of the thermoelectric power generation units, and the output from the thermoelectric power generation units. Thereby, the thermoelectric power generation units can be arranged in consideration of the temperature distribution of the object to be cut, and the power generation efficiency can be improved. Note that matters except for this can be made the same as in any one of the above-described Embodiments 1 to 4 unless otherwise specified.

Figure 6:
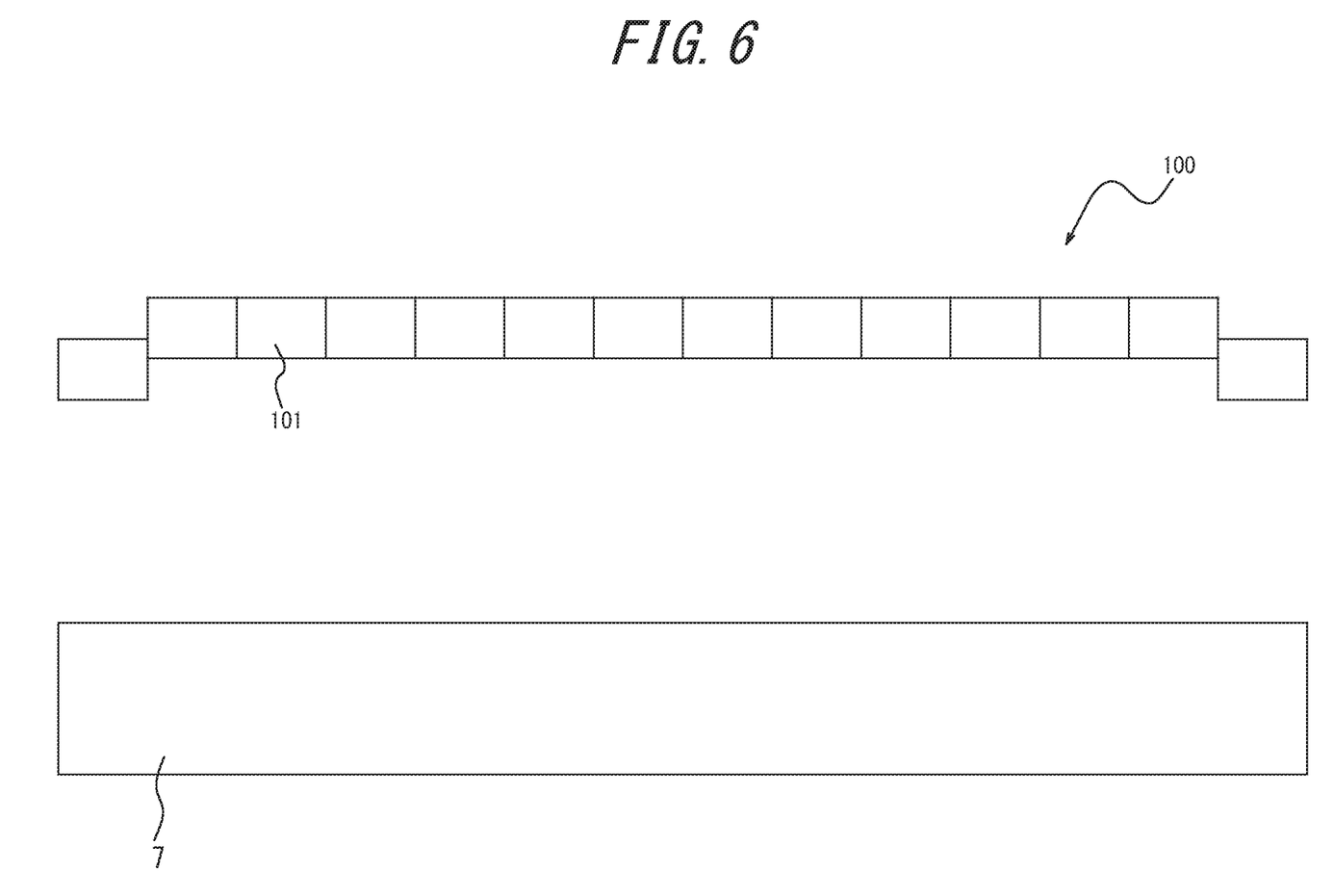
FIG. 6 schematically illustrates an example of the arrangement of thermoelectric power generation units according to Embodiment 5 of the present disclosure.

FIG. 6 schematically illustrates an example of the arrangement of the thermoelectric power generation units according to the present embodiment. Specifically, the arrangement of the thermoelectric power generation units 101 is illustrated in the width direction of the slab 7. The thermoelectric power generation device 100 is constituted by a plurality of thermoelectric power generation units 101.

In addition, the distance between the thermoelectric power generation units 101 and the slab 7 is smaller at the end portions (both ends) than at the central portion in the width direction of the slab 7. Here, the "width direction" refers to the longitudinal direction of the cross section perpendicular to the movement direction of the object to be cut (the slab) (the left-right direction in FIG. 6).

Since the slab 7 in the continuous casting line is cooled faster at the end portions than at the central portion in the width direction, generally, the end portions are lower in temperature than the central portion. For this reason, if all of the thermoelectric power generation units 101 are installed such that the distances between the respective thermoelectric power generation units and the slab 7 are the same, the power generation efficiency at the low-temperature portions (the end portions) are lowered. Therefore, as illustrated in FIG. 6, by setting the distance between the thermoelectric power generation units 101 and the slab 7 at the low-temperature portions (the end portions) smaller than the distance between the thermoelectric power generation units 101 and the slab 7 at the high-temperature portion (the central portion), the power generation efficiency at the low-temperature portions is improved, and the output of the thermoelectric power generation device as a whole can be increased. Further, by disposing the thermoelectric power generation units at the high-temperature portion relatively away from the slab, the power generation efficiency as a whole can be increased while preventing the temperature of the thermoelectric elements from exceeding the heatproof temperature such that the thermoelectric elements are damaged.

In the example illustrated in FIG. 6, only one thermoelectric power generation unit at each end portion (two in total in the case of both end portions) is disposed closer to the slab, and the other thermoelectric power generation units are disposed with the same distance from the slab. However, the distance of the thermoelectric power generation units can be arbitrarily arranged according to the temperature distribution of the object to be cut. For example, the distance between the thermoelectric power generation units and the slab may be arranged so as to become continuously or stepwise smaller from the low-temperature portions (the end portions) toward the high-temperature portion (the central portion).

In the present embodiment, when the low-temperature side of the cutting machine and the low-temperature side of each thermoelectric element are cooled using a water-cooling plate as in Embodiment 1, it is preferable that all of the thermoelectric power generation units arranged at different distances are configured so as to be able to be cooled by the water-cooling plate. Examples of specific methods include the following.

(1) A water-cooling plate having different thicknesses depending on parts is used such that, the low-temperature side (the upper side in FIG. 6) of each thermoelectric power generation unit is in contact with the lower surface of the water-cooling plate, and the lower surface of the cutting machine is in contact with the upper surface of the water-cooling plate.

(2) A thermal conductive spacer is installed in a portion where a gap is formed between the thermoelectric power generation units and the water-cooling plate such that, the thermoelectric power generation units can be cooled by the water-cooling plate via the thermal conductive spacer. As the thermal conductive spacer, for example, a plate, a block or the like made of metal can be used.

(3) The shape of the surface of the cutting machine on which the water-cooling plate is installed is arranged in accordance with the arrangement of the thermoelectric power generation units. For example, the lower surface of the pedestal of the cutting machine is formed as a substantially concave shape recessed toward the width direction central portion of the slab.

Embodiment 6

In the present embodiment, when the object to be cut has a low-temperature portion and a high-temperature portion, thermoelectric elements are installed so as to face the low-temperature portion and the high-temperature portion, and the thermoelectric elements are arranged more densely at the high-temperature portion than at the low-temperature portion. By increasing the density of the thermoelectric elements at the high-temperature portion in this way, the heat of the high-temperature portion is effectively utilized, such that the power generation efficiency as a whole can be further improved.

Figure 7:
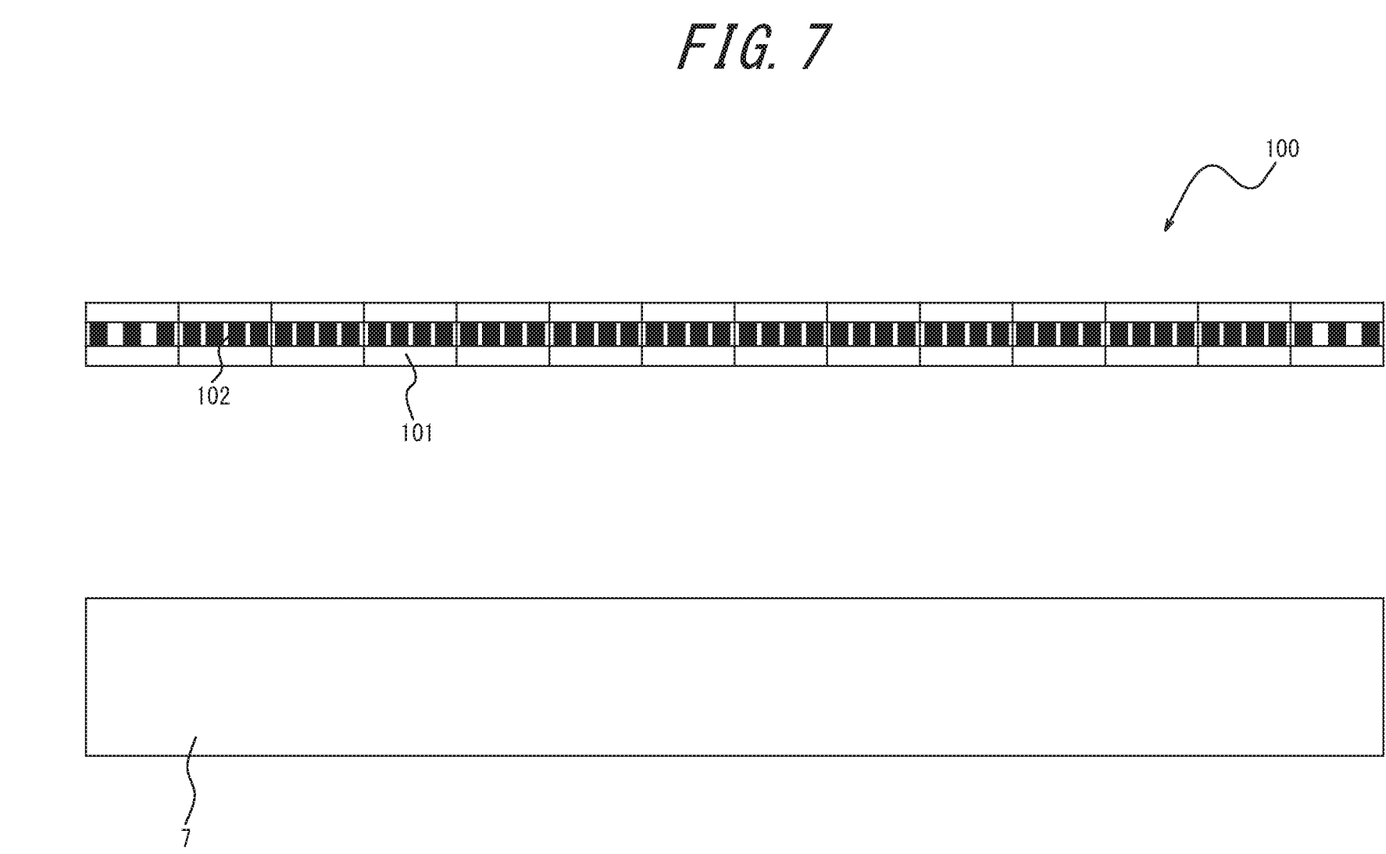
FIG. 7 schematically illustrates an example of the arrangement of thermoelectric elements according to Embodiment 6 of the present disclosure.

FIG. 7 schematically illustrates an example of the arrangement of the thermoelectric elements according to the present embodiment. Specifically, the arrangement of the thermoelectric power generation units 101 and the thermoelectric elements 102 are illustrated in the width direction of the slab 7. The thermoelectric power generation device 100 is constituted by a plurality of thermoelectric power generation units 101, and each thermoelectric power generation unit 101 includes a plurality of thermoelectric elements 102. In addition, the density of the thermoelectric elements is higher at the width direction central portion than at the width direction end portions of the slab 7.

As described above, the temperature of the slab 7 is higher at the central portion than at the end portions in the width direction. For this reason, by setting the density of the thermoelectric elements relatively higher at the width direction central portion as illustrated in FIG. 7, the power generation efficiency as a whole can be improved. Further, according to the method of the present embodiment, the power generation efficiency can be improved without changing the distance between the thermoelectric power generation units and the slab. Therefore, this method can also be used when there is no spatial margin for changing the arrangement of the thermoelectric power generation units.

In the example illustrated in FIG. 7, thermoelectric power generation units having different thermoelectric element numbers (densities) are used; however, it is also possible to use thermoelectric power generation units having the same thermoelectric element number, and adjust the density of the thermoelectric elements by arranging the thermoelectric power generation units at different densities.

[Object to be Cut]

In the above description, examples when cutting a slab in continuous casting were given; however, in the present disclosure, the object to be cut is not limited to a slab, and may be any high-temperature members. Here, the "high-temperature" means having a temperature higher than the room temperature. However, in terms of thermoelectric power generation efficiency, it is preferable to target an object to be cut at 700° C. or more. It is a matter of course that the cutting machine of the present disclosure can also be used for an arbitrary high-temperature object to be cut that is not moving.

EXAMPLES

Example 1

Figure 8:
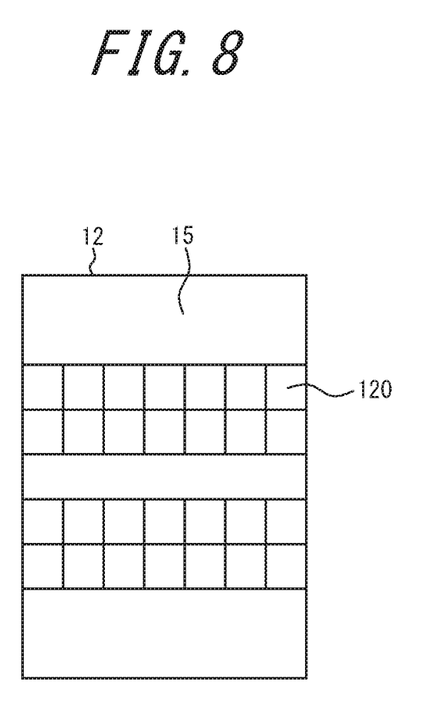
FIG. 8 schematically illustrates an installation form of thermoelectric power generation units according to Examples.

In accordance with Embodiment 1, thermoelectric power generation with a slab in a continuous casting line as the heat source was carried out, using the cutting machine illustrated in FIGS. 1 and 2. As the thermoelectric power generation units, those of 300 mm square were used. As illustrated in FIG. 8, a water-cooling plate 15 was installed on the entire lower surface of the pedestal 12 of the cutting machine, and thermoelectric power generation units 120 were installed on the lower surface of the water-cooling plate 15. The thermoelectric power generation units were arranged in a total number of 28, with 4 rows of 2+2 in the width direction of the slab, and 7 rows in the conveying direction of the slab.

Casting using a dummy bar was started in a dummy bar insertion type continuous casting machine line. Then, after the dummy bar reached the cutting and recovery position, power generation of thermoelectric power generation device was started when the slab reached the cutting machine. Subsequently, cutting was performed while moving the cutting machine in synchronization with the slab to manufacture a continuously cast material.

The continuous casting was performed at a slab temperature of 1000° C., and during the continuous casting, it was able to continuously generate electric power at 95% or more of the rated output. Additionally, during the continuous casting, the temperature of the cutting machine was kept sufficiently low.

Example 2

Thermoelectric power generation with a slab in a continuous casting line as the heat source was carried out under the same conditions as in Example 1, except that a thermoelectric power generation unit further including a heat receiving sheet was used. The area of the thermoelectric element group provided under the heat receiving sheet with respect to the area of the heat receiving sheet, that is, (the area of the thermoelectric element group in each thermoelectric power generation unit/the area of the heat receiving sheet for each thermoelectric power generation unit), was set to 0.32.

The continuous casting was performed at a slab temperature of 1000° C. under the above conditions, and similarly to Example 1, during the continuous casting, it was able to continuously generate electric power at 95% or more of the rated output. Additionally, during the continuous casting, the temperature of the cutting machine was kept sufficiently low.

Example 3

Thermoelectric power generation with a slab in a continuous casting line as the heat source was carried out, using the same cutting machine as in Example 2, except that thermoelectric power generation units with (the area of the thermoelectric element group in each thermoelectric power generation unit/the area of the heat receiving sheet for each thermoelectric power generation unit) being 0.18 was used.

The continuous casting was performed at a slab temperature of 800° C. under the above conditions, and during the continuous casting, it was able to continuously generate electric power at 95% or more of the rated output. Additionally, during the continuous casting, the temperature of the cutting machine was kept sufficiently low.

Example 4

In accordance with the above Embodiment 2, thermoelectric power generation with a slab in a continuous casting line as the heat source was carried out, using the cutting machine illustrated in FIGS. 1 and 2. As the thermoelectric power generation units, those of 300 mm square were used. As illustrated in FIG. 8, a water-cooling plate 15 was installed on the entire lower surface of the pedestal 12 of the cutting machine, and thermoelectric power generation units 120 were installed on the lower surface of the water-cooling plate 15. The thermoelectric power generation units were arranged in a total number of 28, with 4 rows of 2+2 in the width direction of the slab, and 7 rows in the conveying direction of the slab.

Casting using a dummy bar was started in a dummy bar insertion type continuous casting machine line. Then, after the dummy bar reached the cutting and recovery position, power generation of the thermoelectric power generation device was started when the slab reached the cutting machine. Subsequently, cutting was performed while moving the cutting machine in synchronization with the slab to manufacture a continuously cast material.

The continuous casting was performed at a slab temperature of 1000° C., and during the continuous casting, it was able to continuously generate electric power at 95% or more of the rated output. The electric power generated by the thermoelectric power generation device was used to charge the storage battery, and when the cutting was completed, the cutting machine was driven by electric power supplied from the thermoelectric power generation device and the storage battery to return to the initial position.

As described above, according to the present disclosure, it is possible to provide a cutting machine that cuts a high-temperature moving object to be cut while moving in synchronization with the movement of the object to be cut, and that is capable of effectively protecting itself from the heat of the object to be cut and effectively utilizing the heat. Moreover, when a storage battery and a motor is used, it is possible to move the cutting machine without electric power supply from the outside, and more effectively utilize the heat of the object to be cut.

REFERENCE SIGNS LIST

1 Continuous casting line
2 Ladle
3 Tundish
4 Mold
5 Slab cooling device
6 Group of rollers
7 Slab
8 Conveying roller
9 Cutting position
10 Cutting machine
11 Wheel
12 Carriage
13 Cutter
14 Torch
15 Water-cooling plate
15a, 15b Largest surface
16 Flow path
17 Storage battery
20 Rail
100 Thermoelectric power generation device
101 Thermoelectric power generation unit
102 Thermoelectric element
110 Region in which thermoelectric elements are installed

The invention claimed is:

1. A cutting machine for cutting a high-temperature moving object to be cut while moving in synchronization with movement of the object to be cut, comprising:
 a cutter configured to cut the object to be cut;
 a movement device configured to move the cutting machine in synchronization with the object to be cut;
 a water-cooling plate configured to cool the cutting machine; and
 a thermoelectric power generation device including a thermoelectric element for converting heat of the object to be cut into electric energy, wherein
 the movement device comprises a carriage and a clamping device provided on a lower surface of the carriage,
 the cutter is placed on the carriage,
 the water-cooling plate is installed on the lower surface of the carriage so as to be in contact with the lower surface of the carriage,
 the thermoelectric power generation device is installed on a lower surface of the water-cooling plate so as to be in contact with the lower surface of the water-cooling plate,
 the water-cooling plate has a flow path through which cooling water flows inside, and has largest surfaces on both sides formed to be flat, and
 the water-cooling plate also serves to cool a low-temperature side of the thermoelectric element.

2. The cutting machine according to claim 1, further comprising:
 a storage battery configured to accumulate electric power generated by the thermoelectric power generation device; and
 a motor configured to be driven by electric power supplied from at least one of the thermoelectric power generation device or the storage battery to move the cutting machine.

3. The cutting machine according to claim 1, wherein
 the thermoelectric power generation device comprises a plurality of thermoelectric power generation units;
 the object to be cut has a low-temperature portion and a high-temperature portion; and
 a distance between the thermoelectric power generation units and the object to be cut at the low-temperature portion is smaller than a distance between the thermoelectric power generation units and the object to be cut at the high-temperature portion.

4. The cutting machine according to claim 2, wherein
 the thermoelectric power generation device comprises a plurality of thermoelectric power generation units;
 the object to be cut has a low-temperature portion and a high-temperature portion; and
 a distance between the thermoelectric power generation units and the object to be cut at the low-temperature portion is smaller than a distance between the thermoelectric power generation units and the object to be cut at the high-temperature portion.

5. The cutting machine according to claim 1, wherein
 the object to be cut has a low-temperature portion and a high-temperature portion;
 the thermoelectric element is installed so as to face the low-temperature portion and the high-temperature portion; and
 the thermoelectric element is arranged more densely at the high-temperature portion than at the low-temperature portion.

6. The cutting machine according to claim 1, wherein a width of the water-cooling plate is 80% or more of a width of the carriage.

7. The cutting machine according to claim 2, further comprising a power control unit for controlling at least one of the thermoelectric power generation device, the storage battery, and the motor, wherein the power control unit comprises a power supply switching device which can switch whether power is supplied to the motor from the thermoelectric power generation device, the storage battery, or both the thermoelectric generator and the storage battery.

* * * * *